(12) United States Patent
Adams et al.

(10) Patent No.: US 6,614,377 B1
(45) Date of Patent: Sep. 2, 2003

(54) DATA-DIRECTED SCRAMBLER FOR NOISE-SHAPING MIXED-SIGNAL CONVERTERS WITH AN ARBITRARY NUMBER OF QUANTIZATION LEVELS

(75) Inventors: Robert W. Adams, Acton, MA (US); Douglas J. Mar, Austin, TX (US); M. K. Stephen Yeung, Brighton, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/071,603

(22) Filed: Feb. 8, 2002

(51) Int. Cl.[7] .............................. H03M 1/66; H03M 1/12
(52) U.S. Cl. ......................................... 341/144; 341/155
(58) Field of Search ................................. 341/144, 155, 341/148, 150, 143

(56) References Cited

U.S. PATENT DOCUMENTS

| | | |
|---|---|---|
| 5,404,142 A | 4/1995 | Adams et al. |
| 5,406,283 A | 4/1995 | Leung |
| 5,684,482 A | 11/1997 | Galton |
| 5,856,799 A | 1/1999 | Hamasaki et al. |
| 5,977,899 A | 11/1999 | Adams |
| 5,986,595 A | 11/1999 | Lyden et al. |
| 6,456,218 B1 * | 9/2002 | Dedic et al. ............... 341/144 |

OTHER PUBLICATIONS

L. Richard Carley, "A Noise–Shaping Coder Topology for 15+ Bit Converters", IEEE Journal of Solid–State Circuits, vol. 24, No. 2, Apr. 1989, pp. 267–273.

* cited by examiner

Primary Examiner—Jean Bruner Jeanglaude
(74) Attorney, Agent, or Firm—Wolf, Greenfield & Sacks, P.C.

(57) ABSTRACT

Methods and apparatus are provided for processing N equally-weighted digital signals, where N is an arbitrary integer not necessarily an integer power of 2. The methods and apparatus are particularly useful in noise-shaping, mixed-signal converters. The apparatus includes a rotator for rotating the N equally-weighted digital signals in a sequence of rotator states in respective clock cycles to provide N rotated digital signals, and a data-directed scrambler having N inputs and N outputs for data-directed scrambling of the rotated digital signals to distribute the N equally-weighted digital signals to each of the N outputs of the scrambler such that the usage of the N outputs is dynamically balanced over a relatively small number of clock cycles, leading to a shaped noise spectrum.

25 Claims, 18 Drawing Sheets

| NORM/SWAP | OUT A | OUT B |
|---|---|---|
| 1 | IN A | IN B |
| 0 | IN B | IN A |

| CLOCK CYCLE | COLUMN 1 | COLUMN 2 |
|---|---|---|
| 3i + 0 | DIRECT | DIRECT |
| 3i + 1 | DIRECT | SHIFT |
| 3i + 2 | SHIFT | SHIFT |

DATA-DIRECTED SCRAMBLER FOR NOISE-SHAPING MIXED-SIGNAL CONVERTERS WITH AN ARBITRARY NUMBER OF QUANTIZATION LEVELS

FIELD OF THE INVENTION

This invention relates to mixed-signal converters of the sigma-delta noise-shaping type and, more particularly, to mixed-signal converters that employ a multi-bit digital representation of the signal.

BACKGROUND OF THE INVENTION

Recently, sigma-delta, or noise-shaping, mixed-signal converters have come into widespread use. This type of converter uses a relatively coarse quantizer, usually a single bit, embedded in a feedback loop. The feedback loop causes the large quantization noise of the quantizer to become shaped in the frequency domain such that the noise over a small range of the spectrum is very low. The out-of-band noise is then removed by a digital filter in the case of an analog-to-digital converter, or an analog filter in the case of a digital-to-analog converter. Sigma-delta converters exhibit excellent linearity and low quantization noise.

An important feature exploited by noise-shaping mixed-signal converters is oversampling of the signal. This provides bandwidth into which the quantization noise can be transferred, and subsequently filtered, if desired. This procedure improves the resolution of the digital representation of the signal, but only within a relatively small signal bandwidth compared with the sampling frequency. Because these converters are typically designed to have a very high input resolution (often 20 or more bits, or one part in 1 E+6) within their bandwidth specification, they are susceptible to imperfections, mismatch among circuit elements and thermal noise. Therefore, techniques that relax the design tolerances on specific electronic components are useful.

One of the primary obstacles in the design of noise-shaping mixed-signal converters is the problem of removing the large amount of out-of-band noise that is introduced by the digital modulator. Generally, this noise may be filtered, but the switched capacitor filter circuits typically used to accomplish this task are relatively expensive to build and may introduce nonlinear distortions. An alternative is to use multi-bit quantization, in which the digital word consists of more than a single bit. This approach can reduce the quantization noise directly.

An important element in multi-bit noise-shaping mixed-signal converters is the digital-to-analog converter (DAC) circuitry. In multi-bit digital-to-analog (D/A) converters, the DAC structure forms the desired output, whereas in multi-bit analog-to-digital (A/D) converters, the DAC constitutes an important element in the feedback loop. Typically, the DAC structure is configured by using a number N of nominally identical elements, each of which is a 1-bit DAC and provides a unit contribution (either 0 or 1) to a summing junction. The summed output forms the multi-bit DAC output.

Because of actual circuit nonidealities, such as mismatches between capacitors in an array of N capacitors in a switched capacitor array, the beneficial effects of the multi-bit feedback are lost due to the inherent nonlinearity caused by the mismatch. This nonlinearity directly leads to increased quantization noise and harmonic distortion within the signal bandwidth and can significantly degrade the performance of the converter.

A number of methods have been proposed and implemented for counteracting the effects of such mismatches. Many of these methods involve a form of randomization or rotation of the bits that specify which of the individual DACs are to be selected and which are to be deselected in a given clock cycle in an effort to even out, or to average, mismatches. Examples are disclosed in L. R. Carley, "A Noise-Shaping Coder Topology for 15+ Bit Converters," *IEEE J. Solid State Circuits*, SC-24, No. 2, pages 267–273, April 1989; U.S. Pat. No. 5,406,283 issued Apr. 11, 1995 to Leung; and U.S. Pat. No. 5,856,799 issued Jan. 5, 1999 to Hamasaki et al. The main drawback of the disclosed methods is that they typically require many clock cycles to achieve the desired averaging, especially when the number of elements is large. This results in low frequency noise and may thereby degrade the performance in the passband of the converter.

U.S. Pat. No. 5,986,595 issued Nov. 16, 1999 to Lyden et al. attempts to address this problem by replacing the rotations with a more sophisticated sorting procedure that requires extra complexity in the circuitry. U.S. Pat. No. 5,684,482 issued Nov. 4, 1997 to Galton extends these ideas to handle the case of increased shaping order, but at the cost of introducing more complex switching logic as well as a nonlocal memory, which can be costly to implement in circuit layout. Moreover, Galton's method works only for the case where the number of elements is equal to an integer power of 2.

U.S. Pat. No. 5,404,142 issued Apr. 4, 1995 to Adams et al. discloses a data-directed scrambling technique that relieves the burden of tight analog component matching. The quantized noise-shaped word is first converted to a "thermometer code", where for an N-bit quantized word, $2^N$ equally-weighted elements are used. In the thermometer code, the number of output bits set to one is equal to the input value. The fact that the output bits are equally-weighted allows dynamic mapping of digital input bits to analog elements of the digital-to-analog converter. By using an array of swapping elements whose state is controlled by the data itself, errors caused by analog mismatches can be manipulated, thereby shaping the noise in the output spectrum. Therefore, most of the noise energy can be moved out of the band of interest.

In the technique disclosed by Adams et al., each of the switching units, called a "2×2 swapper cell," has two inputs and two outputs, and these units are arranged in a "butterfly architecture" similar to one commonly used in Fast Fourier Transform (FFT) algorithms. To further reduce the pattern tones, a randomizing pre-shifter can be used, as in the AD1853, a stereo multi-bit sigma-delta DAC sold by Analog Devices, Inc. The advantages of this method include its simple logic, which is local, and requires only 1-bit memories, and its efficiency: only $(N/2) \log_2 N$ switching units are required for a thermometer encoder with N input levels. However, one restriction of this method is that it works only when the number of input levels is equal to an integer power of 2.

Accordingly, it is desirable to provide scrambling methods and apparatus for noise-shaping mixed-signal converters wherein one or more of the above drawbacks are overcome. For example, relaxing the constraint that the number of input levels to the multi-bit DAC has to be an integer power of 2 will allow more flexible designs when the desired accuracy calls for more elements but there is not enough chip area or power available to double the number of elements.

SUMMARY OF THE INVENTION

According to an aspect of the invention, a scrambling system comprises a rotator and a data-directed scrambler that can be used for arbitrary choices of N, the number of input levels. The rotator comprises an array of rotator cells, and the data-directed scrambler includes swapper cells and direct connections in appropriate places. An N-level equally-weighted digital signal is input to the rotator cells. The N outputs of the rotator cells are connected to the N inputs of the data-directed scrambler, and the N outputs of the data-directed scrambler are the final scrambled output. The operation of the scrambling system is controlled by a clock signal. At each successive clock cycle, the number of steps by which the inputs are shifted by the rotator may change by a given number. In addition, on each clock cycle, each swapper cell connects its two inputs to its two outputs, either directly or reversely, depending on the state of the two inputs and an additional state bit that represents the integrated difference of past swapper outputs.

Accordingly, apparatus is provided, in accordance with a first aspect of the invention, for processing N equally-weighted digital signals, where N is not an integer power of 2. The apparatus comprises a rotator for rotating the N equally-weighted digital signals in a sequence of rotator states in respective clock cycles to provide N rotated digital signals, and a data-directed scrambler having N inputs and N outputs for data-directed scrambling of the rotated digital signals to distribute the N equally-weighted digital signals to each of the N outputs of the scrambler such that the usage of the N outputs is dynamically balanced over a relatively small number of clock cycles. This allows one to manipulate the errors in the power spectrum.

The rotator may comprise circuit elements for advancing through a predetermined number of rotator states, wherein the N inputs of the rotator are shifted by a different number of steps with respect to the N outputs of the rotator in each of the rotator states. The circuit elements of the rotator may comprise rotator cells for performing a selected shift in response to a control signal and a sequencer for generating the control signal in response to a clock signal. The number N of digital signals may be of the form $M \times 2^k$, where M is an odd integer and k is an integer. The rotator may have M rotator states. The N inputs of the rotator may be rotated (or shifted, modulo N) by 0, N/M, 2N/M, . . . (M−1) N/M steps in respective rotator states. Preferably, the predetermined number of rotator states is selected such that the frequency with which the rotator states are repeated is outside the signal band of the digital signals.

The rotator may comprise two or more sets of rotator cells connected in series between the N inputs and the N outputs of the rotator. Each of the sets of rotator cells passes its inputs directly to its outputs or shifts, modulo N, its inputs by a predetermined number of steps in response to a control signal. The rotator may further comprise a sequencer for providing control signals to the sets of rotator cells in response to a clock signal.

The data-directed scrambler may comprise one or more swapper cells and one or more direct connections interconnected to provide mutually exclusive selectable signal paths from the N inputs to the N outputs. Each of the swapper cells may comprise two input terminals to receive respective inputs and two output terminals to produce corresponding outputs, circuitry responsive to a select signal for connecting the two input terminals to the two output terminals, either directly or reversely, and logic for generating the select signal. The logic may comprise logic circuitry for storing the integrated difference of past swapper cell output signals, for determining a new value of the select signal based on the current two input values to the swapper cell and the stored integrated difference, and for updating the value of the stored integrated difference.

The data-directed scrambler may comprise two or more sets of elements connected in series between the N inputs and the N outputs of the data-directed scrambler. Each of the sets of elements may comprise swapper cells, or a combination of swapper cells and direct connections. The swapper cells may be connected in an FFT-like partial butterfly configuration. Direct connections are utilized in place of a swapper cell in each location of the partial butterfly configuration that does not require a swapper cell for swapping inputs to that location. Each of the swapper cells comprises circuitry responsive to a select signal for connecting two input terminals to two output terminals, either directly or reversely, and logic for generating the select signal.

According to another aspect of the invention, a method is provided for processing N equally-weighted digital signals, where N is not an integer power of two. The method comprises the steps of rotating the N equally-weighted digital signals in a sequence of rotator, states in respective clock cycles to provide N rotated digital signals, and data-directed scrambling of the N rotated digital signals in a data-directed scrambler having N inputs and N outputs to distribute the N equally-weighted digital signals to each of the N outputs of the scrambler such that the usage of the N outputs is dynamically balanced over a relatively small number of clock cycles.

According to a further aspect of the invention, apparatus is provided for processing N equally-weighted digital signals, where N is not an integer power of 2. The apparatus comprises a routing circuit, responsive to control signals and having N inputs and N outputs, for distributing the N equally-weighted digital signals to each of the N outputs such that the usage of the N outputs is dynamically balanced over a relatively small number of clock cycles, and a controller for generating the control signals in response to the digital signals and a sequencing signal.

According to a further aspect of the invention, a digital-to-analog converter is provided. The digital-to-analog converter comprises a code converter for converting a digital input to N equally-weighted digital signals, where N is not an integer power of 2, a rotator for rotating the N equally-weighted digital signals in a sequence of rotator states in respective clock cycles to provide N rotated digital signals, a data-directed scrambler having N inputs and N outputs for data-directed scrambling of the rotated digital signals to distribute the N equally-weighted digital signals to each of the N outputs of the scrambler such that the usage of the N outputs is dynamically balanced over a relatively small number of clock cycles, a digital-to-analog converter including N equally-weighted digital-to-analog converter elements for converting the scrambled digital signals to analog outputs, and a summing circuit for summing the outputs of the digital-to-analog converter elements to produce an analog output that represents the digital input.

According to a further aspect of the invention, an analog-to-digital converter is provided. The analog-to-digital converter comprises a summing unit for subtracting a feedback signal from an analog input signal and providing a summing unit output, a loop filter for receiving the summing unit output and providing a filter output signal, a multi-bit quantizer for providing a digital output in response to the filter output signal, and a digital-to-analog converter responsive to the digital output for providing the feedback signal to the summing unit. The digital-to-analog converter may be configured as described above. The digital output of the multi-bit quantizer represents the analog input signal.

BRIEF DESCRIPTION OF THE DRAWINGS

For a better understanding of the present invention, reference is made to the accompanying drawings, which are incorporated herein by reference and in which:

FIG. 14A shows the case of no scrambling; FIG. 14B shows the case of scrambling without rotating; FIG. 14C shows the case of scrambling with rotating by one step per clock cycle; FIG. 14D shows the case of scrambling with rotating by N/M steps per clock cycle with M=3; FIG. 14E shows the ideal case with perfect components, where neither scrambling nor rotation is necessary;

DETAILED DESCRIPTION

Figure 1:
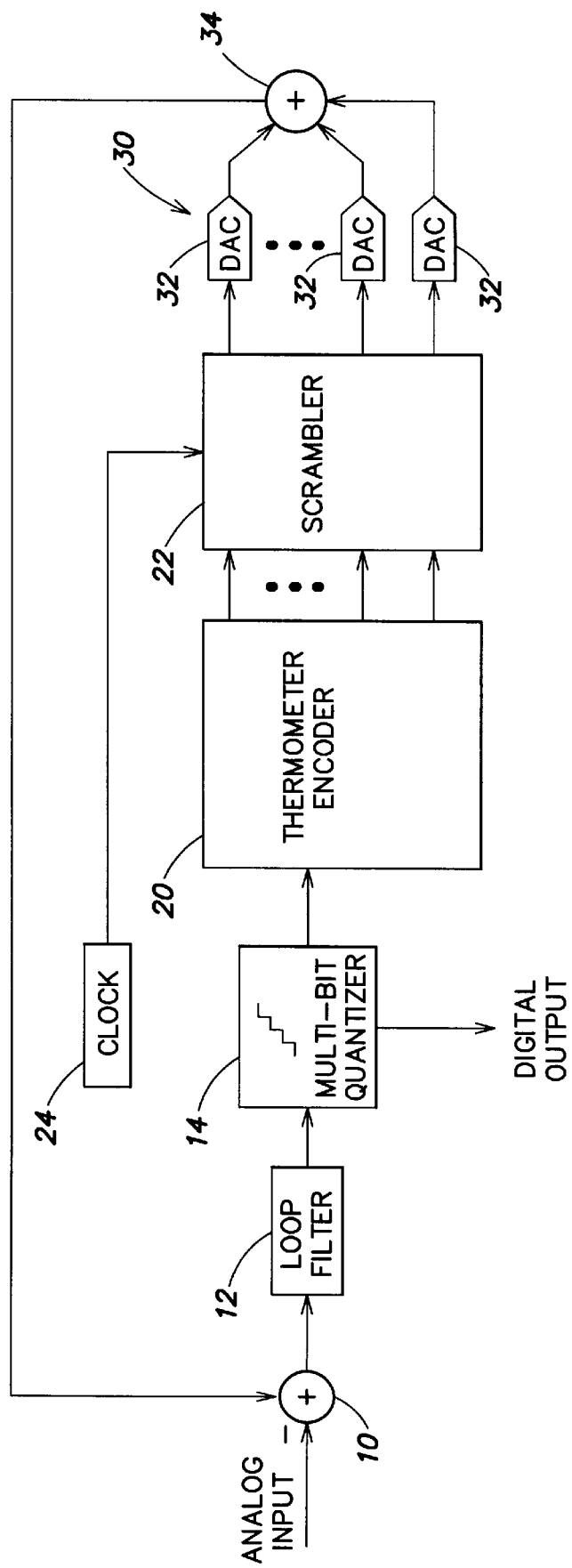
FIG. 1 is a block diagram of a prior art multi-bit noise-shaping analog-to-digital converter with an encoder and a scrambler in the feedback path.

A prior art multi-bit noise-shaping analog-to-digital converter utilizing a data-directed scrambler, as disclosed in the aforementioned U.S. Pat. No. 5,404,142 to Adams et al., is described with reference to FIGS. 1–4. As shown in FIG. 1, an analog input is supplied through a summing circuit 10 to a loop filter 12. A multi-bit quantizer 14 converts the analog output of loop filter 12 to a digital output and supplies this digital output to a thermometer encoder 20. The thermometer encoder 20 supplies one bit for each quantization level, and the number of output bits set to one is equal to the input value. The outputs of the thermometer encoder 20 are equally-weighted. The equally-weighted output bits of thermometer encoder 20 are 79 supplied to a scrambler 22. The equally-weighted input bits are dynamically mapped by scrambler 22 to its outputs such that the number of selected inputs is equal to the number of selected outputs on every clock cycle. Moreover, the usage of the outputs is dynamically balanced over a relatively small number of clock cycles. A clock 24 supplies a clock signal to scrambler 22. The outputs of scrambler 22 are supplied to a digital-to-analog converter 30 including nominally equally-weighted DAC elements 32 and a summing circuit 34. The analog outputs of DAC elements 32 are summed by summing circuit 34, and the sum is subtracted from the analog input by summing circuit 10 to form a closed loop. In the configuration of FIG. 1, the number N of quantization levels in the multi-bit quantizer 14 is limited to an integer power of 2.

Figure 2:
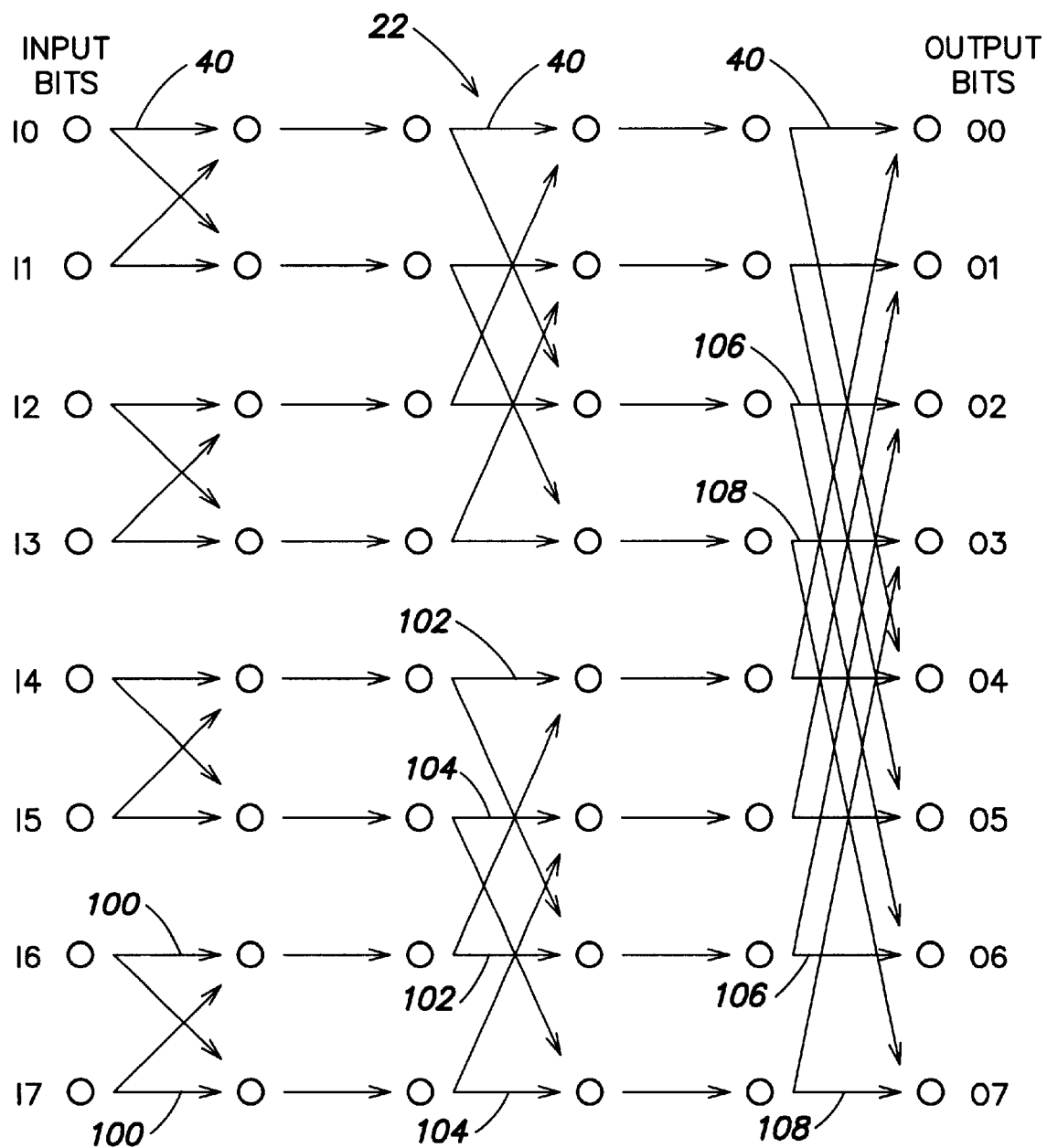
FIG. 2 is a schematic block diagram of an eight-input butterfly scrambler.

A schematic block diagram of scrambler 22 is shown in FIG. 2 for the case N=8. Scrambler 22 includes data-directed swapper cells 40 connected in an FFT-like butterfly configuration. In the context of FFT, the topology of FIG. 2 is the flow graph of a radix-2 decimation in frequency FFT algorithm, with inputs in bit-reversed order and outputs in normal order.

Figures 3A, 3B:
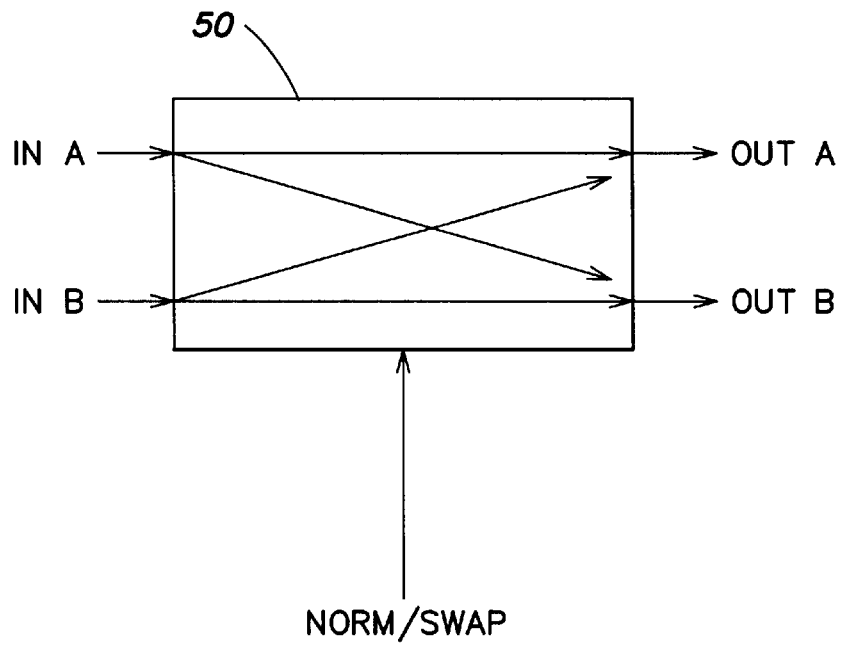
FIG. 3A is a schematic diagram of a switching circuit used in the scrambler of FIG. 2.
FIG. 3B is a table that illustrates the states of the switching circuit shown in FIG. 3A.

As shown in FIGS. 3A and 3B, each swapper cell 40 includes a switching circuit 50 that connects inputs A and B to outputs A and B, either directly or reversely, in response to a normal/swap control signal. As described in the aforementioned U.S. Pat. No. 5,404,142, the control signal is supplied by logic circuitry which responds to the states of the inputs of the swapper cell and the state of a difference signal developed as the integrated difference of prior swapper output signals. The functioning of the scrambler thus is controlled by the actual received data. This has the effect of shifting the noise due to an error in weighting to higher frequencies, out of the passband.

Figure 4:
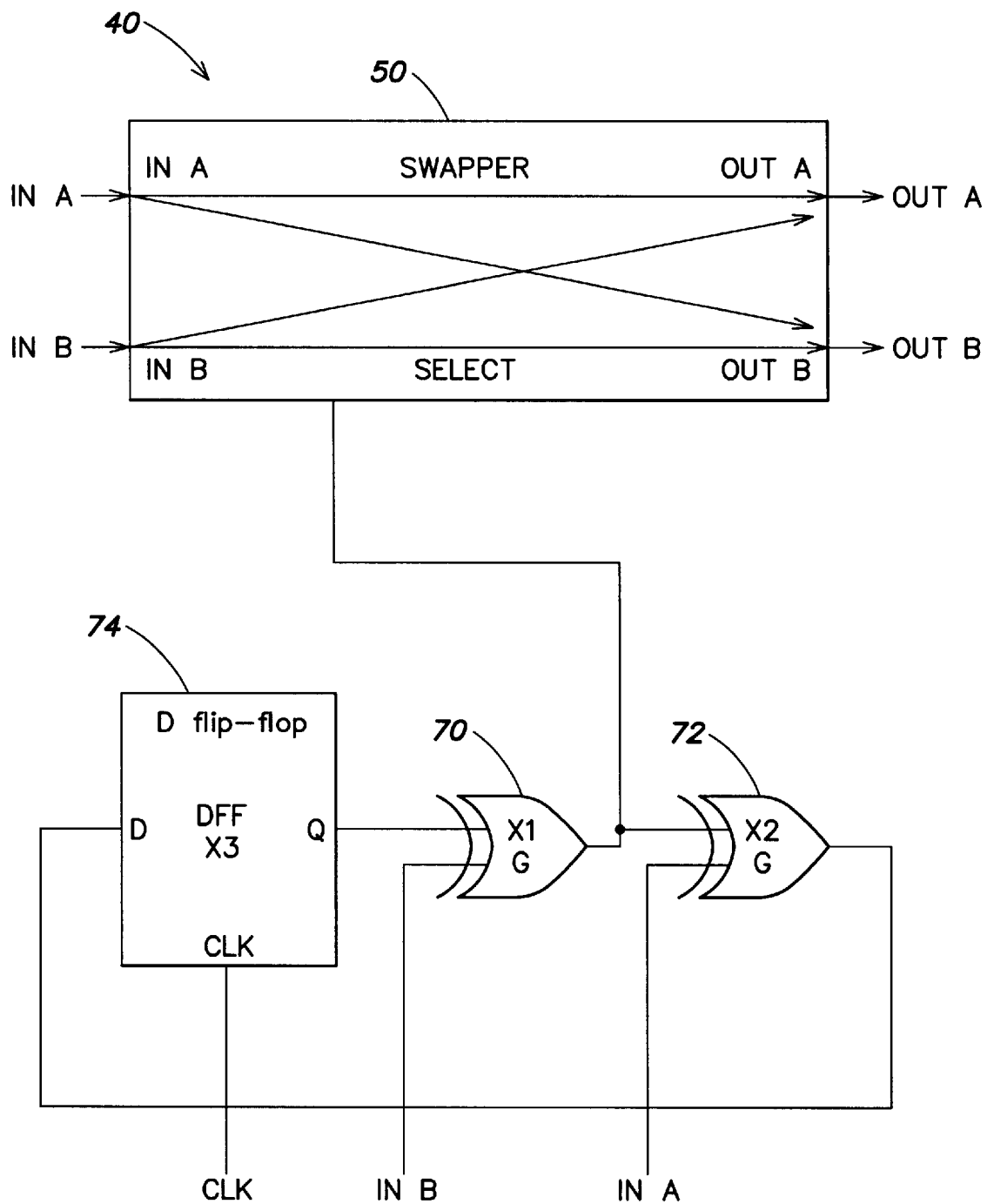
FIG. 4 is a block diagram of an embodiment of a data-directed swapper cell.

An embodiment of swapper cell 40 is shown in FIG. 4. Swapper cell 40 includes switching circuit 50, exclusive OR gates 70 and 72 that receive inputs A and B, respectively, and flip-flop 74 that receives the output of exclusive OR gate 72 and supplies an input to exclusive OR gate 70. The output of exclusive OR gate 70 provides the control signal to switching circuit 50.

The scrambling technique shown in FIGS. 2–4 and described above is an efficient way of scrambling, since only $(N/2) \log_2 N$ rather than $N^2$ swapper cells are required if the number N of input bits is an integer power of 2. However, this scrambling technique is inapplicable if N is not an integer power of 2. In many applications, the required number N of quantization levels is not equal to an integer power of 2. Using the prior art approach, it is necessary to construct a mixed-signal converter with the number of quantization levels being the next higher integer power of 2. This results in additional circuitry that is not fully utilized. According to a feature of the present invention, this restriction on the number N of quantization levels is removed.

When the number N of inputs is not an integer power of 2, the scrambling technique shown in FIG. 2 is no longer applicable. This case can be more readily understood if we conceptually insert n imaginary thermometer input bits so that N+n, the total number of real and imaginary thermometer input bits, is an integer power of 2. We may then employ a circuit that is a modification of the standard radix-2 scrambler of FIG. 2, in which no swapper cells are used if the imaginary thermometer bits are involved. In that case, a direct connection is used.

Figure 5:
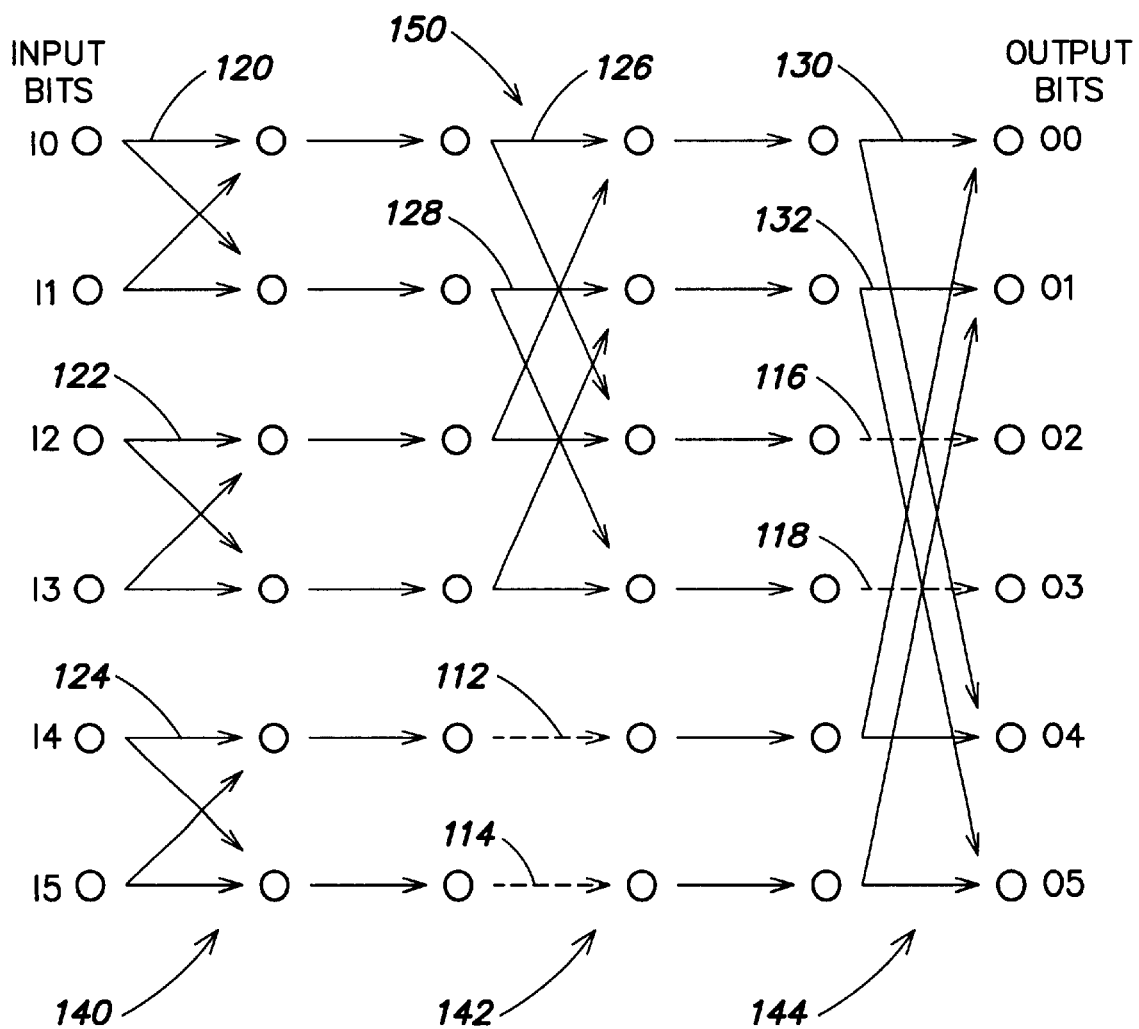
FIG. 5 is a schematic diagram of a six-input butterfly scrambler.

An example of a scrambler 150 for the case N=6 is shown in FIG. 5. By comparing FIGS. 2 and 5, it may be observed that inputs 16 and 17 are eliminated in the six-input scrambler 150 of FIG. 5. Scrambler 150 uses a FFT-like partial butterfly configuration wherein direct connections are utilized in each location of the butterfly configuration that does not require swapping of the inputs to that location. Because of the smaller number of input signals, swapper cells 100, 102, 104, 106 and 108 in FIG. 2 are not required and can be eliminated. Swapper cells 102, 104, 106 and 108 in FIG. 2 are replaced by direct connections 112, 114, 116 and 118, respectively, in FIG. 5. Where the number of inputs is not an integer power of 2, the scrambler thus includes a number of swapper cells and a number of direct connections. The scrambler 150 of FIG. 5 includes swapper cells 120, 122, 124, 126, 128, 130 and 132, and direct connections 112, 114, 116 and 118. Referring to FIG. 5, it may be observed that direct connections 112, 114, 116 and 118 are used in each location of the FFT-like partial butterfly configuration that does not require swapper cells for swapping of inputs to that location. It will be understood that a number of different scrambler topologies produce equivalent results for a given value of N.

The scrambler 150 of FIG. 5 may be implemented as two or more columns, or sets, each of which includes swapper cells, or a combination of swapper cells and direct connections. The embodiment of FIG. 5 includes sets 140, 142 and 144. Each set has N inputs and N outputs. In the embodiment of FIG. 5, set 140 receives inputs I0–I5 and provides six outputs to set 142. Set 142 receives six inputs from set 140 and provides six outputs to set 144. Set 144 receives six inputs from set 142 and provides outputs O0–O5. Set 140 includes swapper cells 120, 122 and 124; set 142 includes swapper cells 126 and 128 and direct connections 112 and 114; and set 144 includes swapper cells 130 and 132 and direct connections 116 and 118.

The scrambler shown in FIG. 5 results in some outputs being used more frequently than others. This would lead to harmonic distortion if the scrambler was used in a noise-shaping analog-to-digital converter of the type shown in FIG. 1. The present invention solves this problem by utilizing a rotator for rotating, or shifting, the inputs before scrambling. This results in the usage of the outputs of the scrambler being dynamically balanced over a relatively small number of clock cycles, but at the cost of introducing a periodic wave. The period of the wave is N clock cycles if the inputs are rotated by one step per clock cycle. In a noise-shaping analog-to-digital converter of the type shown in FIG. 1, this will lead to a pronounced harmonic at frequency $f_s/N$, where $f_s$ is the sampling frequency. This may degrade the performance in the signal band when N is comparable to the oversampling ratio. In such cases, instead of shifting by one step per clock cycle, it is preferable to shift by a larger number of steps per clock cycle so as to keep the period of the rotation relatively short and thereby to shift the harmonic distortion away from the signal band. This strategy has the additional advantage that the hardware is easier to build. For example, if N is of the form $M \times 2^k$, where M is an odd prime number and k is an integer, then rotating by N/M steps per clock cycle shifts the harmonic distortion to the frequency $f_s/M$ This is far from the signal band for small M, for example, M=3 or M=5.

Figure 6:
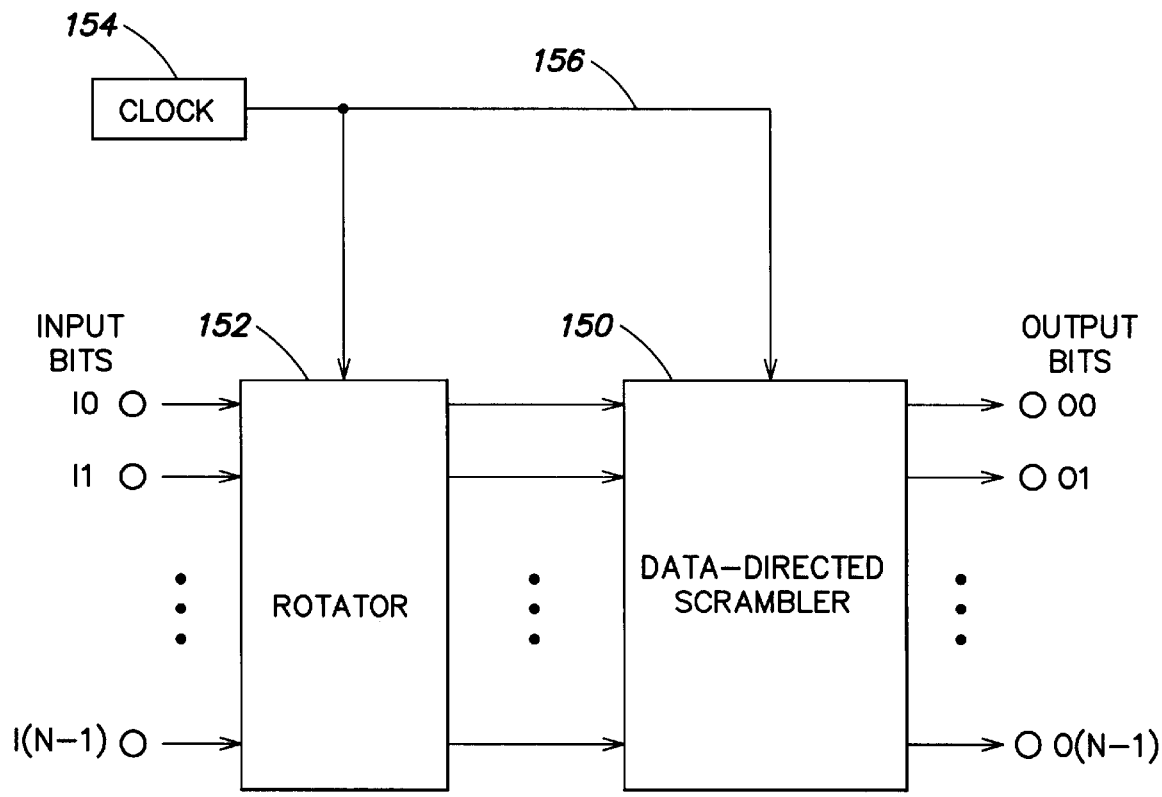
FIG. 6 is a block diagram of a scrambling system in accordance with an embodiment of the invention.

A block diagram of a scrambling system in accordance with an embodiment of the invention is shown in FIG. 6. The scrambling system includes data-directed scrambler 150 and a rotator 152. A clock 154 supplies a clock signal 156 to data-directed scrambler 150 and to rotator 152. Rotator 152 receives equally-weighted digital input signals I0, I1 . . . I(N−1), where N is not an integer power of 2. Rotator 152 supplies N outputs to N inputs of data-directed scrambler 150. Data-directed scrambler 150 provides N outputs O0, O1, . . . O(N−1). The scrambling system processes the digital input signals such that the digital input signals are equally represented in outputs O0, O1, . . . O(N−1) in a relatively short time, such as a few clock cycles.

The data-directed scrambler 150 may include a combination of swapper cells and direct connections in a butterfly-type architecture as shown by way of example in FIG. 5 and described above. In particular, a data-directed scrambler having N inputs, where N is not an integer power of 2, can be configured as the conventional butterfly architecture of swapper cells, with swapper cells replaced with direct connections where appropriate due to the lack of input bits. Thus, the data-directed scrambler 150 includes a combination of swapper cells and direct connections in the butterfly architecture. The swapper cells may be implemented as described above in connection with FIGS. 3A, 3B, and 4.

The rotator 152 advances through a predetermined number of rotator states in a repeating sequence. In each rotator state, the rotator outputs are shifted by a predetermined number of steps. The rotator 152 may be viewed as a barrel shifter that is preprogrammed to operate in a known sequence.

Figure 7:
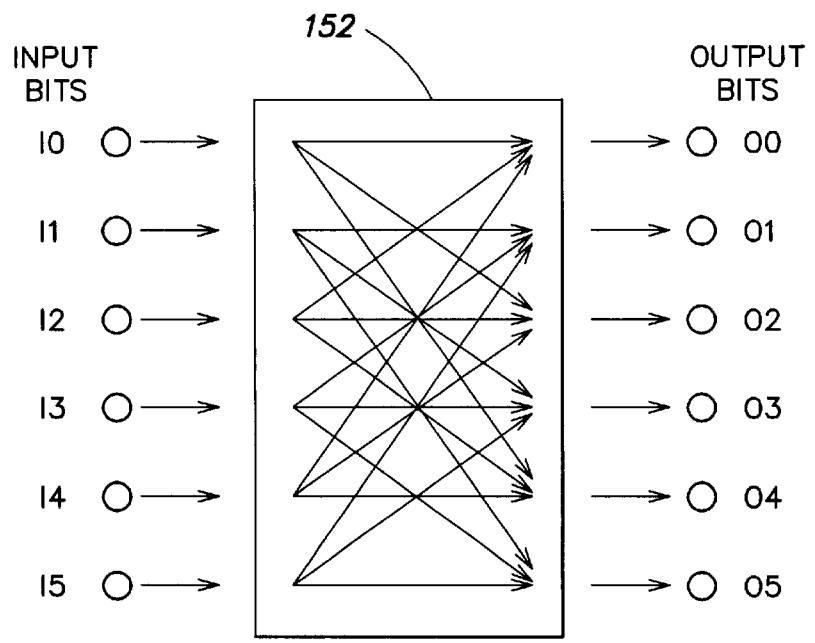
FIG. 7 is a schematic diagram of a six-input rotator having three rotator states.
Figure 8A:
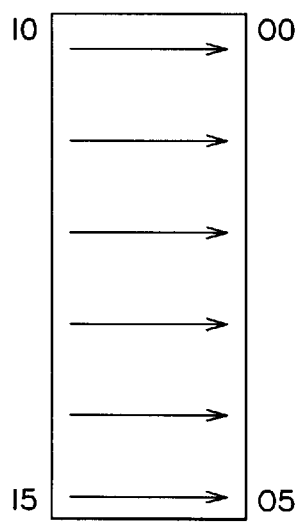
FIGS. 8A–8C illustrate the rotator states of the rotator shown in FIG. 7.
Figure 8B:
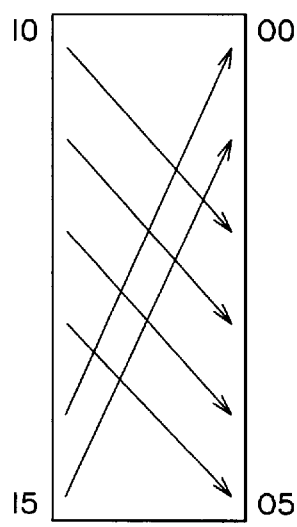
Figure 8C:
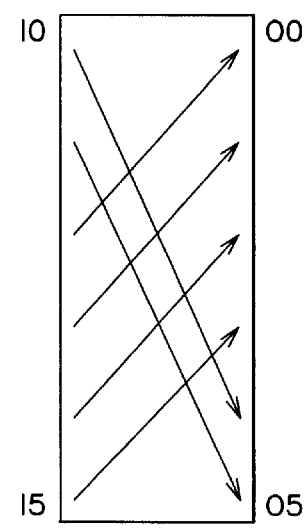
Figure 9:
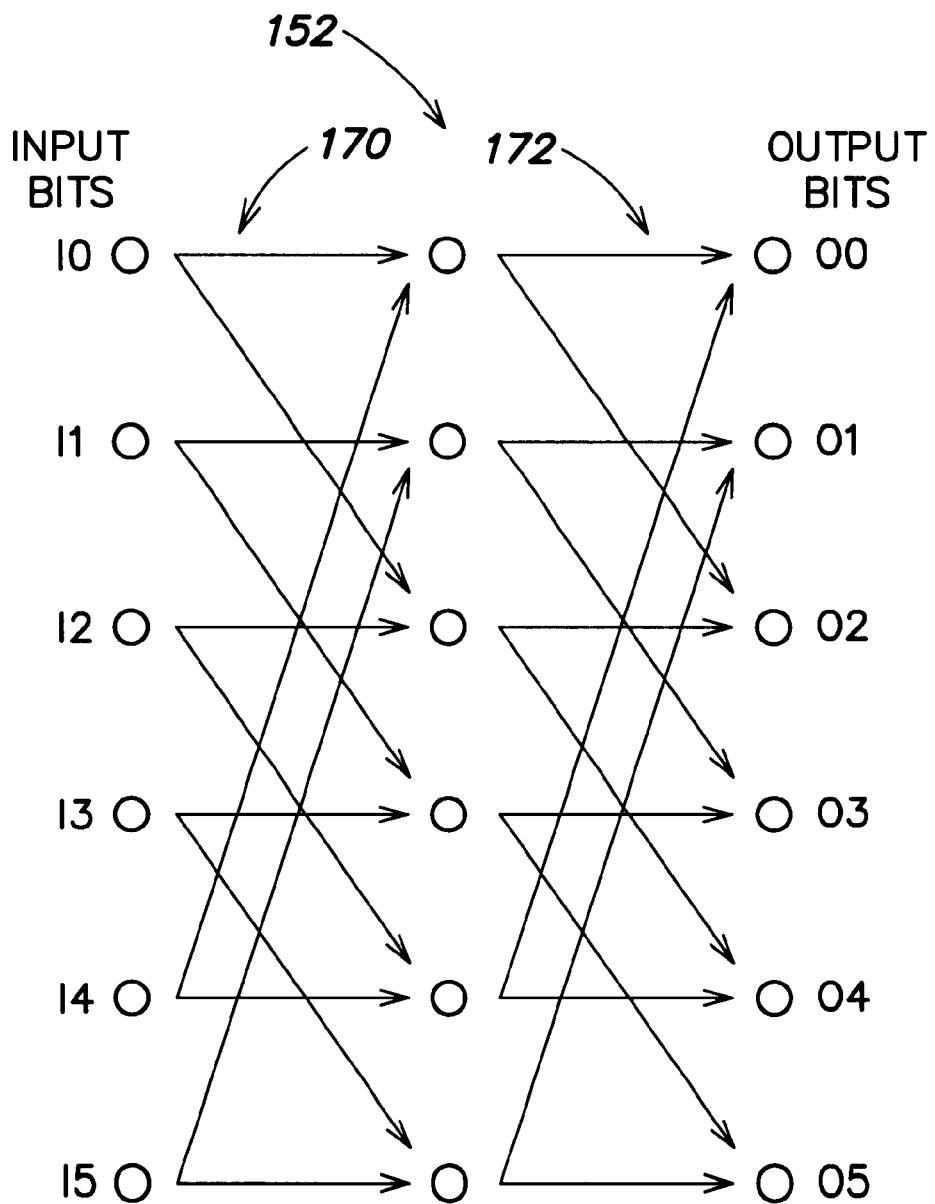
FIG. 9 is a schematic diagram of a two-column rotator having six inputs and three rotator states.

A schematic diagram of an example of rotator 152 for the case of six inputs and three rotator states is shown in FIG. 7. The individual rotator states are shown in FIGS. 8A–8C. A rotator topology for implementing the rotator of FIG. 7 is shown in FIG. 9. In this example, the jth input is mapped directly to the jth output at clock cycles 0, 3, 6, 9, . . . ; to the (j+2)th output at clock cycles 1, 4, 7, 10, . . . ; and to the (j+4)th output at clock cycles 2, 5, 8, 11, . . . , with the indices taken modulo N. However, this choice is for the purpose of illustration and is not the only possible choice of rotation step. There is much flexibility to accommodate other constraints for a particular application. It should be noted that when M is not a prime number but a composite, it is desirable to use an encoder consisting of a series of rotators, as described below, since this reduces the amount of hardware while retaining the same performance.

In the example of FIGS. 7 and 8A–8C, rotator 152 has three rotator states. In a first rotator state shown in FIG. 8A, inputs I0–I5 are connected directly to outputs O0–O5, respectively (no shift). In a second rotator state shown in FIG. 8B, each input is shifted by two steps. Thus, input I0 is shifted to output O2, input I1 is shifted to output O3, etc. The final two inputs I4 and I5 are wrapped around and are shifted to outputs O0 and O1, respectively. In a third rotator state shown in FIG. 8C, each input is shifted by four steps. Thus, input I0 is shifted to output O4, input I1 is shifted to output O5, input I2 is shifted to output O0, etc. The rotator then returns to the first rotator state shown in FIG. 8A in a repeating sequence. It will be understood that the rotator may operate with an increasing number of steps, a decreasing number of steps or an arbitrary sequence.

An algorithm for implementing rotator 152 with six inputs and three rotator states is shown in FIG. 9. Rotator 152 is implemented as two columns, or sets, including a first column 170 and a second column 172. Each of columns 170 and 172 maps its inputs directly to the respective outputs without any shift or shifts each input by N/M=2 steps.

Together, columns 170 and 172 may rotate inputs I0–I5 by 0, 2 or 4 steps, as shown in FIGS. 8A–8C.

Figures 10A, 10B:
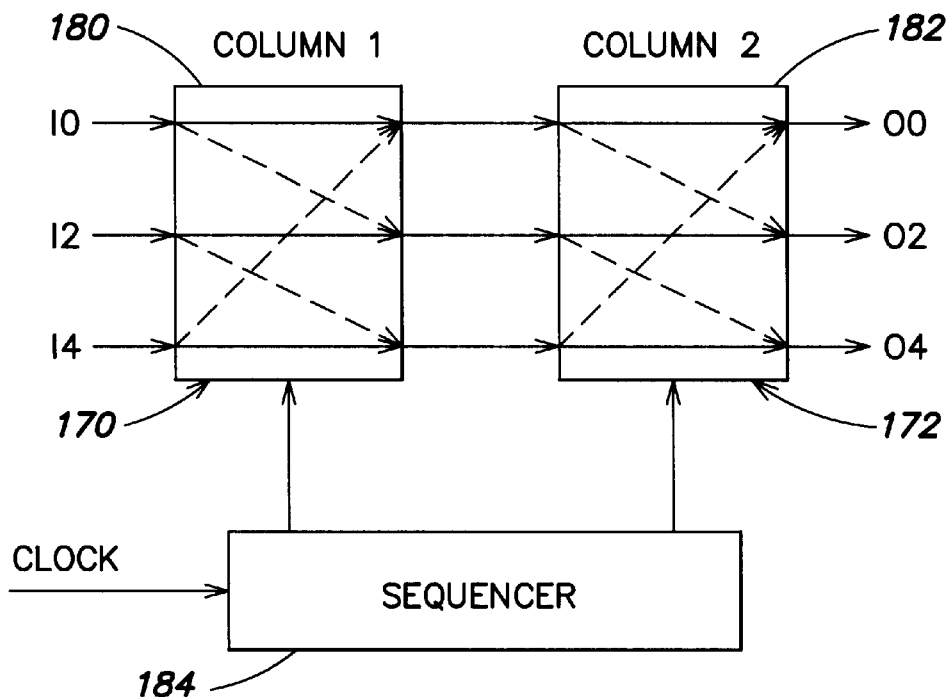
FIG. 10A is a schematic block diagram of a set of rotator cells for implementing one-half of a six-input rotator having three rotator states.
FIG. 10B is a table that illustrates the rotator states of the rotator cells shown in FIG. 10A.

An implementation of rotator 152 is described with reference to FIGS. 10A and 10B. As shown in FIG. 10A, a rotator cell 180 in column 170 receives inputs I0, I2 and I4 and supplies outputs to a rotator cell 182 in column 172. Rotator cell 182 provides outputs O0, O2 and O4. Each of rotator cells 180 and 182 shifts its inputs by zero steps (indicated by solid lines) or two steps (indicated by dashed lines) in response to control signals from a controller implemented as a sequencer 184. Two additional rotator cells (not shown), one in each column, having the same configuration are utilized for rotating inputs I1, I3 and I5 to provide outputs O1, O3 and O5. The sequencer 184 generates binary control signals in response to a clock in accordance with the table of FIG. 10B. In the table of FIG. 10B, DIRECT indicates a zero step shift (no shift) and SHIFT indicates a two-step shift. Sequencer 184 may be implemented as a three-state counter for a rotator having three rotator states. More generally, a controller controls the states of the rotator.

The rotator 152 of FIG. 6 thus may be implemented as two or more columns, or sets, of rotator cells and a sequencer. Each set of rotator cells has N inputs and N outputs, and the sets of rotator cells are connected in series. Each set of rotator cells passes its inputs directly to its outputs (no shift) or shifts its inputs by a predetermined number of steps in response to a control signal provided by the sequencer. The sets of rotator cells provide a selected number of rotator states, and the sequencer advances through the rotator states in a periodic manner.

When M is not a prime number but a composite, it is desirable to use an encoder consisting of a series of rotators, with each rotator carrying out the rotation for a factor of M, as this reduces the amount of hardware while retaining the same performance. For example, when M=15=3×5, using two rotators, one with three rotational steps and the other with five rotational steps, connected in series, is more efficient in terms of hardware requirements than using one rotator with 15 rotational steps.

Figure 11:
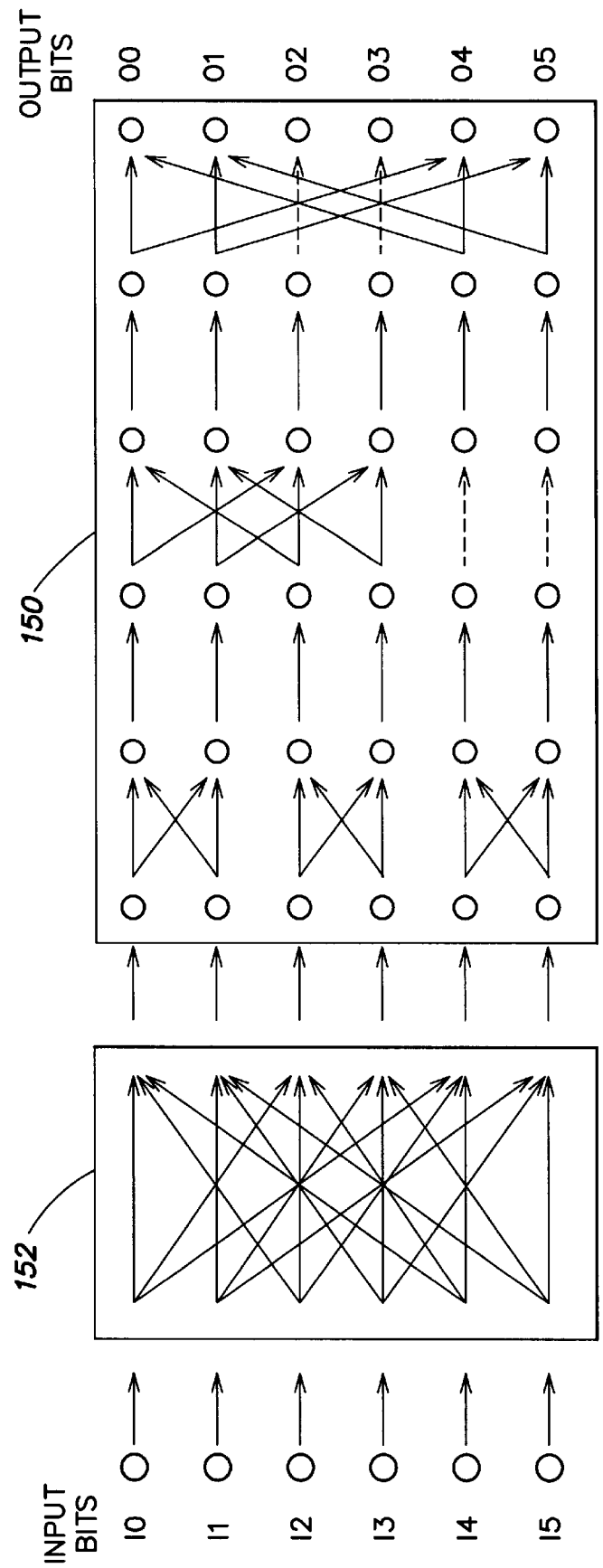
FIG. 11 is a schematic diagram of a rotator-corrected six-input scrambling system.

A six-input scrambling system including a six-input data-directed scrambler 150 and a six-input rotator 152 having three rotator states is shown in FIG. 11. It will be understood that the invention can be utilized for different values of N, the number of inputs, where N is not an integer power of 2. While the invention is particularly efficient for the case $N=M\times 2^k$, with M being a small odd prime integer and k being an integer, the invention can be used for any choice of N.

In the scrambler of FIG. 11, it may be observed that the swapper cells either swap or do not swap pairs of inputs. For this reason, rotator 152 preferably shifts inputs by an even number of steps (0, 2, 4, etc.) to avoid duplicating the function of scrambler 150 and to ensure that the usage of the outputs is dynamically balanced over a relatively small number of clock cycles.

Figure 12:
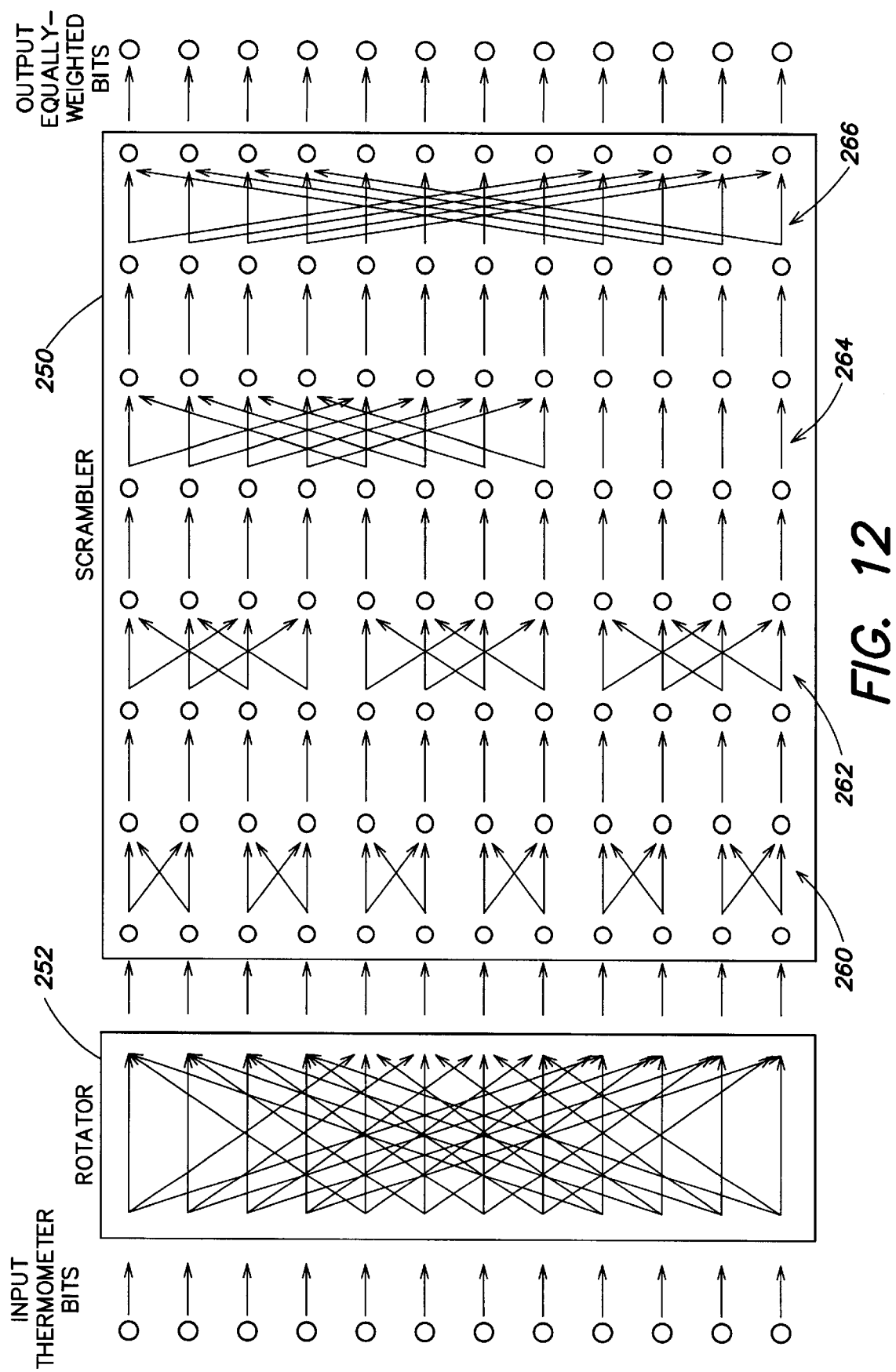
FIG. 12 is a schematic diagram of a rotator-corrected twelve-input scrambling system.

A twelve-input scrambling system including a twelve-input data-directed scrambler 250 and a twelve-input rotator 252 having three rotator states is shown in FIG. 12. In the embodiment of FIG. 12, N=12, M=3 and k=2. Scrambler 250 includes four columns, or sets, 260, 262, 264 and 266, each of which includes swapper cells or a combination of swapper cells and direct connections. In particular, sets 260 and 262 each include six swapper cells. Sets 264 and 266 each include four swapper cells and four direct connections. Rotator 252 shifts its inputs by 0, 4 and 8 steps in different rotator states, so that the usage of the outputs of scrambler 250 is dynamically balanced over a relatively small number of clock cycles.

The number of rotator states is selected based, at least in part, on the band of the digital signals being converted. In particular, the number M of rotator states should be selected such that the rotator frequency $f_s/M$ is outside the signal band of the digital signals being converted. This may vary depending on whether a low-pass filter or a band-pass filter is being utilized in the converter.

Figure 13:
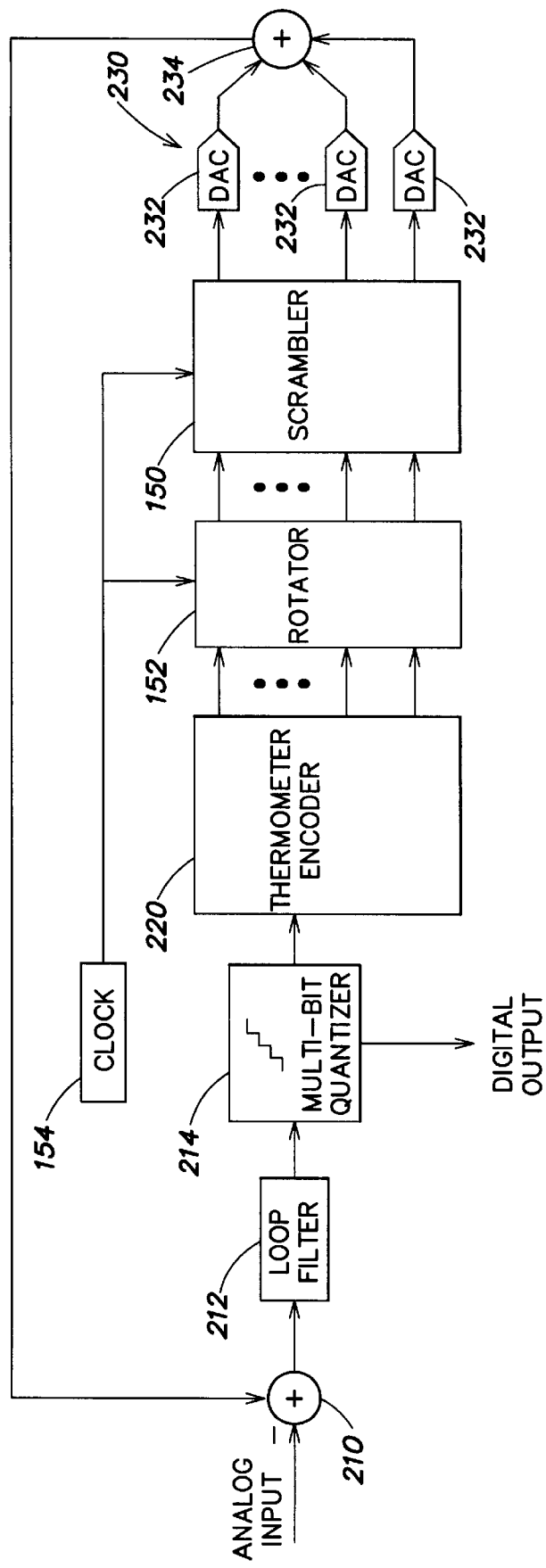
FIG. 13 is a schematic block diagram of a multi-bit noise-shaping analog-to-digital converter with a rotated and scrambled thermometer encoded output in accordance with an embodiment of the invention.

The rotator-corrected scrambling system described above can be used as part of a multi-bit digital-to-analog converter in a multi-bit noise-shaping converter, as shown in FIG. 13. The converter includes summing circuit 210, loop filter 212, multi-bit quantizer 214, thermometer encoder 220, rotator 152, data-directed scrambler 150, clock 154, and a digital-to-analog converter 230 including DAC elements 232 and summing circuit 234. The analog outputs of DAC elements 232 are summed by summing circuit 234, and the sum is subtracted from the analog input by summing circuit 210 to form a closed loop. The thermometer encoder 220 provides N equally-weighted digital signals, where N is not an integer power of 2. Rotator 152 and data-directed scrambler 150 may be configured as described above.

Figure 14B:
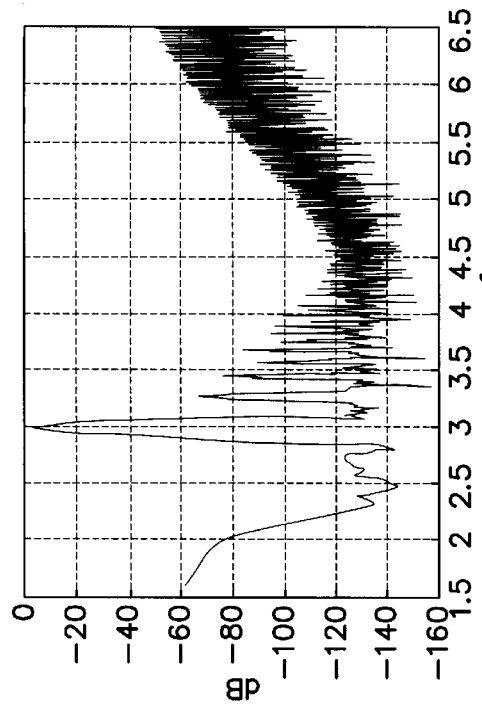
FIGS. 14A–14E are power spectra for various configurations of a multi-bit noise-shaping analog-to-digital converter, wherein power in dB is plotted as a function of the logarithm of frequency and the number of quantization levels N=24.
Figure 14A:
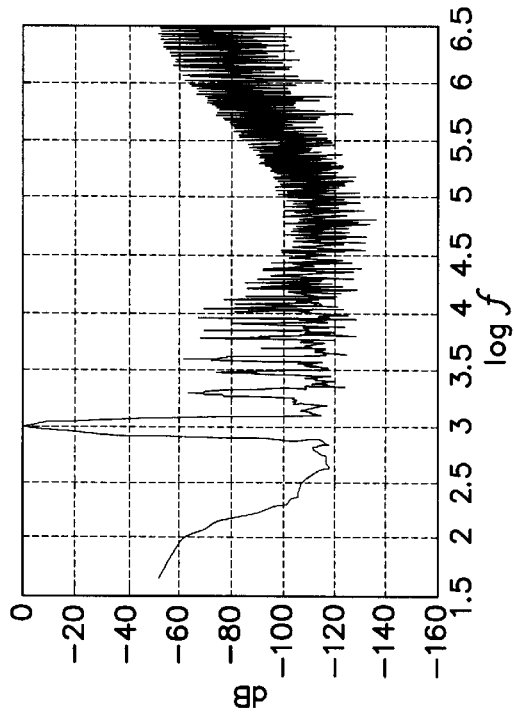
Figure 14C:
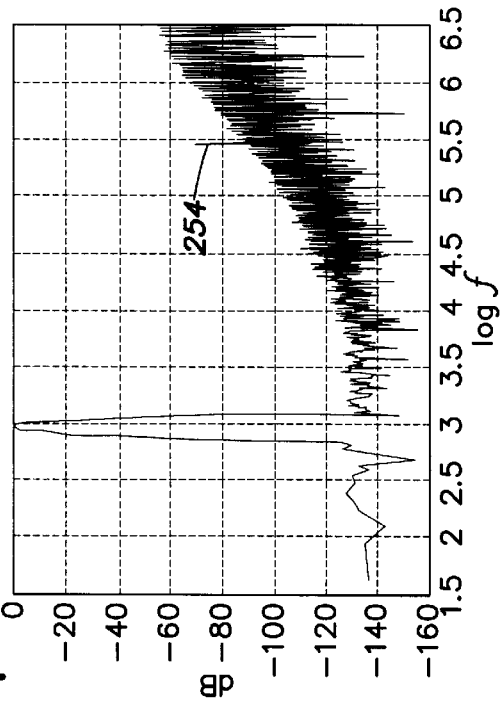
Figure 14E:
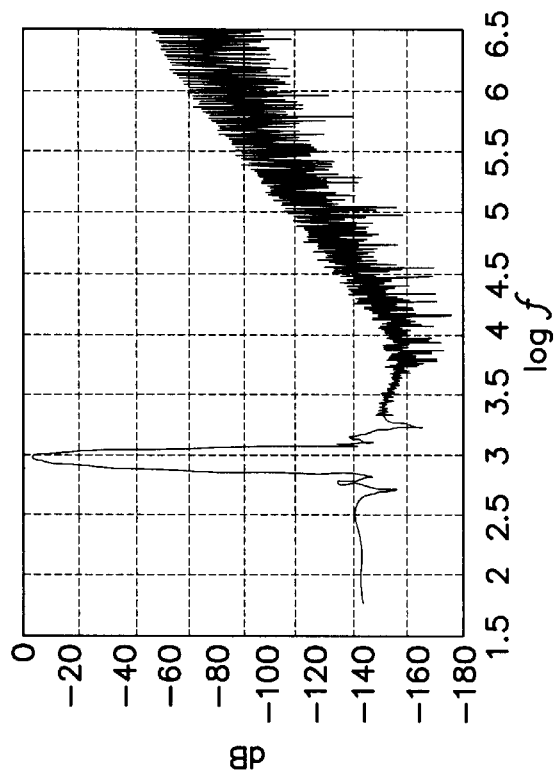
Figure 14D:
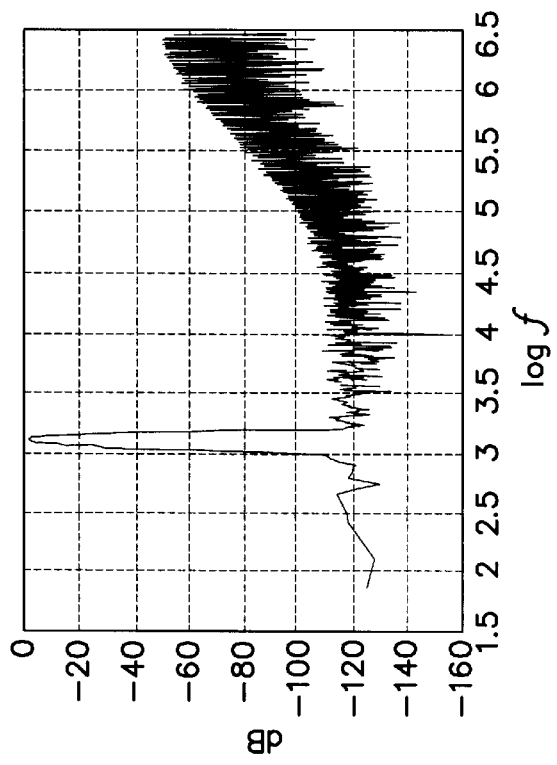

In the multi-bit sigma-delta loop, the thermometer encoder output bits represent the total input signal plus noise-shaped terms. FIGS. 14A–14E show power spectra of the digital output for various configurations of the analog-to-digital converter of FIG. 13. In FIGS. 14A–14E, the number of quantization levels $N=24=3\times 2^3$, and the input is a sinusoidal signal at 1 kilohertz. If the components in an unoptimized multi-bit sigma-delta loop are ideal, the spectral density of noise is known to be given by $$N(f)=\Delta\sqrt{2/(3f_s)}[2 \sin (\pi f/f_s)]^p \qquad (1)$$

where $\Delta$ is the spacing in the quantizer 214, $f_s$ is the sampling frequency and p is the shaping order of the loop filter. This ideal case is illustrated in FIG. 14E. However, the performance is much degraded by mismatch of components, heterogeneity and thermal noise. An implementation of the converter shown in FIG. 13 without rotator 152 and scrambler 150 leads to undesirable harmonic distortions in the signal band, as illustrated in FIG. 14A. If the data-directed scrambler 150 is utilized without a rotator, some, but not all, of the in-band harmonic distortions are suppressed, as illustrated in FIG. 14B, because some DAC elements 232 are used more often than others. With a rotator that rotates one step per clock cycle, all of the original in-band harmonic distortions can be suppressed, but a pronounced peak 254 at frequency $f_s/N$ is introduced, as shown in FIG. 14C. In a preferred embodiment wherein the rotator rotates N/M steps per clock cycle, all of the original in-band harmonic distortions are suppressed without introducing a pronounced peak at frequency $f_s/N$, as illustrated in FIG. 14D. A closer examination reveals that there is a peak at frequency $f_s/M$. However, this peak lies far from the signal band and is therefore easily removable by conventional filtering.

Figure 15:
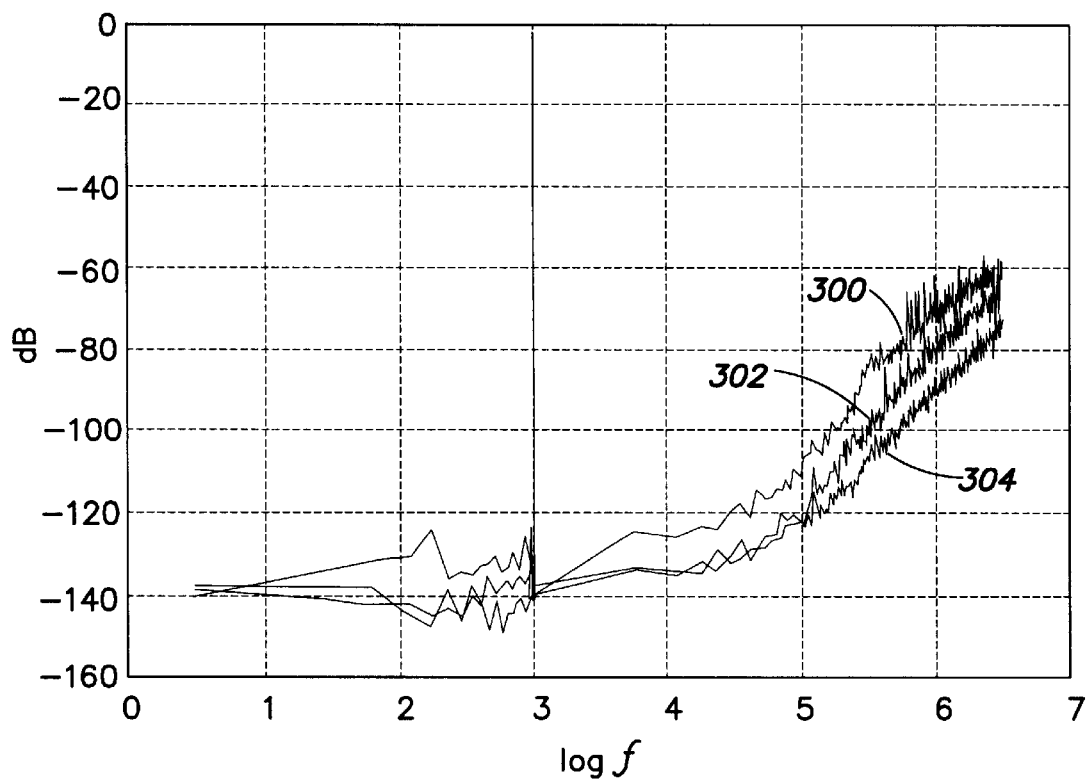
FIG. 15 shows power spectra for a preferred embodiment of the analog-to-digital converter shown in FIG. 13, for different numbers of quantization levels.
Figure 16:
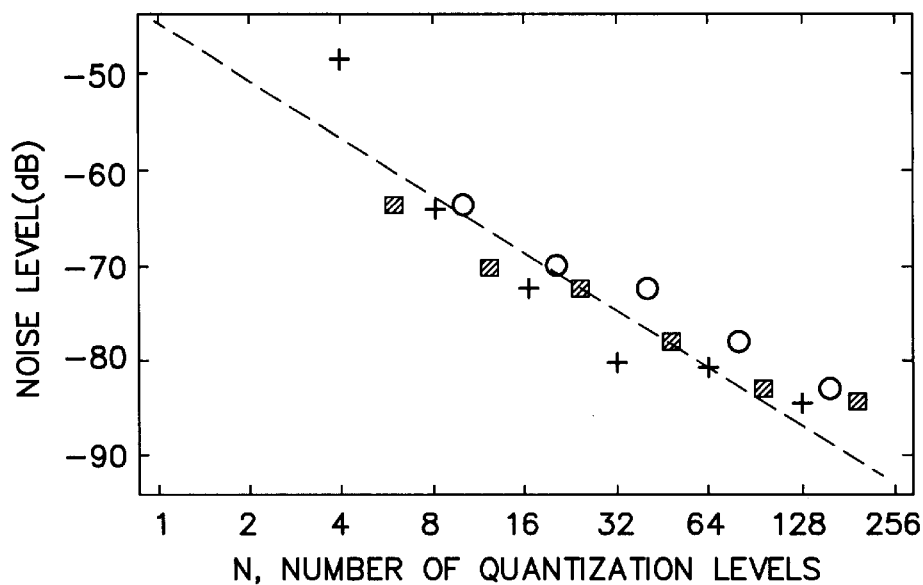
FIG. 16 is a graph of high frequency noise level in dB as a function of N, the number of quantization levels.
Figure 17:
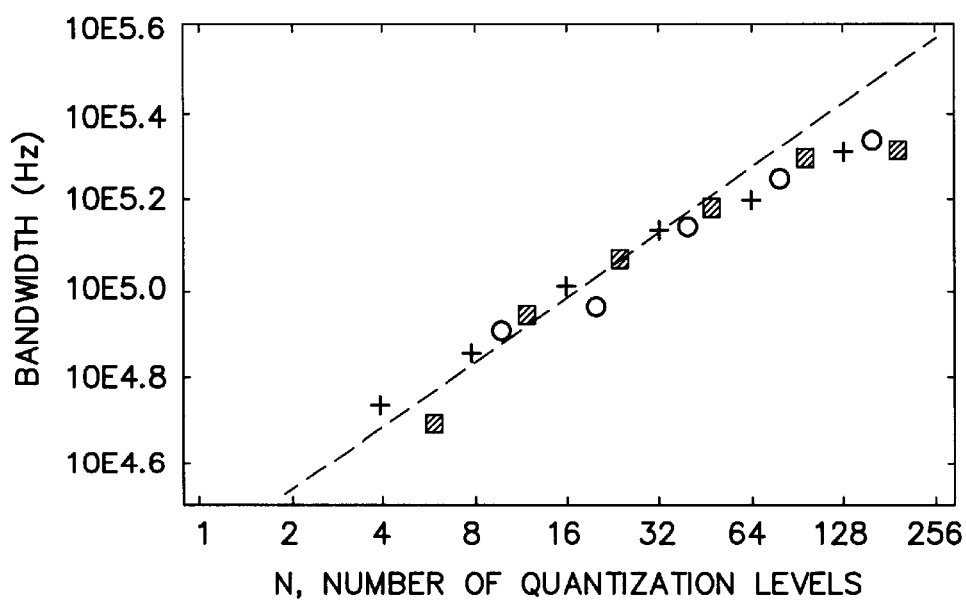
FIG. 17 is a graph of bandwidth, for a given specification of signal-to-noise ratio, as a function of N, the number of quantization levels.

Using the rotator-corrected scrambling system described herein in a multi-bit sigma-delta loop, a spectral density of noise comparable to the theoretical estimate of Equation (1) for the ideal case can be obtained in the signal band, except for thermal noise. Moreover, by varying N, the number of thermometer levels and the number of DAC elements, the quantizer spacing $\Delta$ is effectively varied, since A is proportional to 1/N. Thus, with the rotator-corrected scrambling system, which permits arbitrary choice of N, the performance may be controlled in a scalable way. This is illustrated in FIG. 15, for the choices N=6, 32 and 192, with an input signal at 1 kilohertz. In FIG. 15, curve 300 corresponds to N=6, curve 302 corresponds to N=32 and curve 304 corresponds to N=192. If other values of N are selected, the noise level changes in an approximately continuous manner. As a result, the noise level scales with 1/N. This is illustrated in FIG. 16 where noise level in dB at 1 megahertz is plotted as a function of N. In FIGS. 16 and 17, "+" represents $N=2^k$ (prior art), "■" represents $N=3\times2^k$, and "o" represents $N=5\times2^k$. The dashed line represents 1/N scaling. Meanwhile, the usable bandwidth scales with $N^{1/p}$ for pth-order noise-shaping loop filters. This is illustrated in FIG. 17 for a second-order sigma-delta loop. In FIG. 17, the bandwidth is plotted as a function of N, the number of quantization levels. The dashed line in FIG. 17 represents $N^{1/2}$ scaling. That all data points are close to this line indicates that the present invention achieves the same scaling performance as the prior art.

The above example illustrates the application of the invention in a low-pass, unoptimized multi-level sigma-delta loop. However, the invention is not limited to this application and can be used in any circuit which uses multi-level feedback, such as circuits involving cascades of integrators or cascades of resonators.

An advantage of the disclosed approach is that if a particular output weight is incorrect, most of the error occurs at high frequencies, and very little of the error occurs in the frequency band of interest. Also, since each output bit represents one input bit plus noise-shaped terms, an error in the output weight does not cause harmonic distortion. These advantageous properties are present in the prior art disclosed in U.S. Pat. No. 5,404,142. However, whereas the prior art is restricted to the case where the number of input bits, and thus the number of quantization levels, must be an integer power of 2, the present invention does not have this restriction. The number of input levels, and thus the number of quantization levels, can be any positive integer. The removal of this restriction leads to greater flexibility in the design of multi-bit A/D and D/A converters in the presence of physical constraints, such as non-ideal components and limited chip area, and provides scalable performance.

Another advantage of the invention is its simplicity, both at the conceptual level and at the implementation level. Simplicity at the conceptual level permits easy design, while simplicity at the implementation level translates into reduced chip area and lower cost.

The present invention requires the use of a rotator. However, the hardware cost of the rotator is small, because there are only a few possible rotator configurations. For example, if N, the number of input levels is of the form $N=M\times2^k$ for some positive integer k and prime number M, then the rotator may rotate by 0, N/M, 2N/M, ... (M−1) N/M. That is, there are only M possible rotator states. Using successive columns, each of which either maps all the inputs directly to the outputs without any rotation or rotates all the inputs by a step of N/M to the outputs (with output indices modulo N), the number of columns in the rotator can be bounded by the smallest integer larger than or equal to $\log_2 M$. In the example shown in FIGS. 7–9, with N=6 and M=3, only two rotator columns are required. The control signals for the rotator columns are derived from the system clock, as shown in FIG. 10B.

In terms of the number of swapper cells required, the present invention is comparable to the prior art disclosed in U.S. Pat. No. 5,404,142, which achieves very efficient scrambling for the case where N is an integer power of 2. In this case, the number of swapper cells S(N) is given by $$S(N)=(N/2)\log_2 N \qquad (2)$$

The present invention achieves a similar O (N $\log_2$ N) scaling. In particular, $$S(N)=(N/2)\log_2(N/3)+2N/3 \text{ for } N=3\times2^k \qquad (3)$$

$$S(N)=(N/2)\log_2(N/5)+N \text{ for } N=5\times2^k \qquad (4)$$

Figure 18:
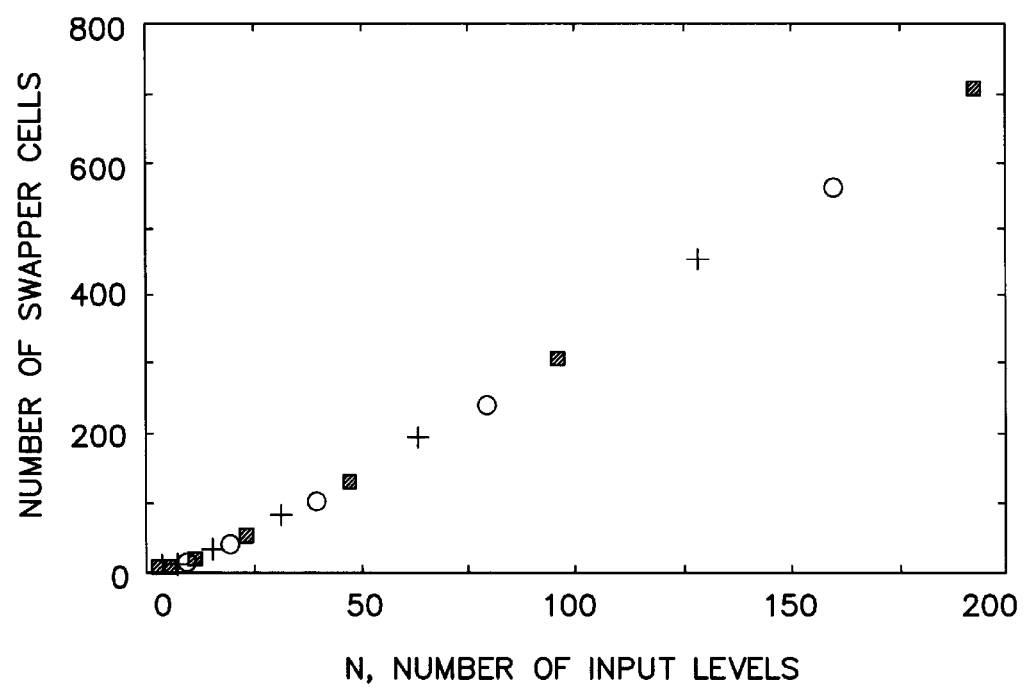
FIG. 18 is a graph of the required number of swapper cells as a function of N, the number of input levels.

This is illustrated in FIG. 18, where the required number of swapper cells is plotted as a function of N, the number of input levels. In FIG. 18, "+" represents $N=2^k$ (prior art), "■" represents $N=3\times2^k$, and "o" represents $N=5\times2^k$.

By replacing some swapper cells with direct connections, the scrambling technique disclosed in U.S. Pat. No. 5,404,142 has been generalized to cope with the case of an arbitrary number of inputs. This, together with a rotator, which is inexpensive because of its small number of possible rotator states, provides a way to realize multi-bit digital-to-analog conversion for an arbitrary number of quantization levels, thereby gaining low out-of-band noise benefits, while retaining the excellent distortion characteristics of 1-bit converters. This generalization permits scalable implementation, leading to greater flexibility in the design of multi-bit A/D and D/A converters in the presence of physical constraints, such as non-ideal components and limited chip area. The performance of the rotator-corrected scrambling technique described herein is comparable to the scrambling technique described in the aforementioned U.S. Pat. No. 5,404,142. In particular, analog matching requirements may be relaxed by as much as 30 dB compared to other approaches, such as the random scrambler technique disclosed in the aforementioned article by L. R. Carley. This allows very high resolution and scalable noise-shaping analog-to-digital converters and digital-to-analog converters to be implemented in modest cost CMOS processes.

Figure 19:
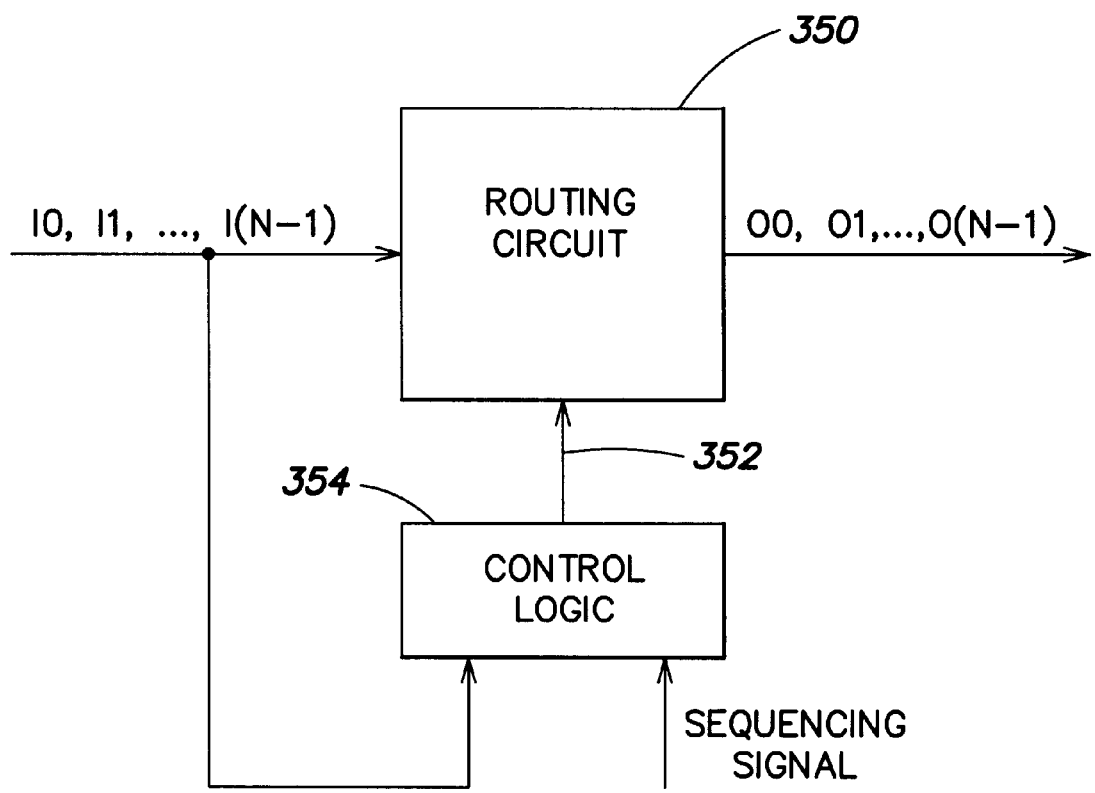
FIG. 19 is a block diagram of a scrambling system in accordance with an alternate representation of the invention.

A block diagram of a scrambling system in accordance with an alternate representation of the invention is shown in FIG. 19. A routing circuit 350 receives equally-weighted digital inputs I0, I1, ..., I(N−1) and provides digital outputs O0, O1, ..., O(N−1). The routing circuit 350 uniformly distributes the N equally-weighted input signals to its N outputs over a relatively small number of clock cycles in response to control signals 352 provided by control logic 354. Control logic 354 generates control signals 352 in response to a sequencing signal, such as a clock signal, and the digital inputs I0, I1, ..., I(N−1).

The scrambling system of FIG. 19 performs the same function as the scrambling system shown in FIG. 6 and described above. By comparing the architectures of FIGS. 19 and 6, it may be observed that routing circuit 350 corresponds to rotator 152 and data-directed scrambler 150 of FIG. 6, with the control portions of rotator 152 and data-directed scrambler 150 incorporated into control logic 354. Thus, switching circuit 50 (FIG. 4) of each swapper cell and the direct connections of data-directed scrambler 150 are incorporated into routing circuit 350; and exclusive OR gates 70 and 72 and flip-flop 74 (FIG. 4) of each swapper cell of data-directed scrambler 150 are incorporated into control logic 354. In addition, the rotator cells 180 and 182 (FIG. 10A) of rotator 152 are incorporated into routing circuit 350, and sequencer 184 (FIG. 10A) of rotator 152 is incorporated into control logic 354.

The foregoing describes the correspondence between the scrambling systems of FIGS. 6 and 19. However, it will be understood that the scrambling system of FIG. 19 is not limited to the architecture shown in the example of FIG. 6.

It should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. For example, the number of inputs may be arbitrarily selected in a scalable way, as suggested by FIGS. 16 and 17; and some or all aspects of the rotator and of the scrambler may be combined, as indicated in FIG. 19. The invention is limited only as defined in the following claims and the equivalents thereto.

What is claimed is:

1. Apparatus for processing N equally-weighted digital signals, where N is not an integer power of 2, comprising:
   a rotator for rotating N equally-weighted digital signals in a sequence of rotator states in respective clock cycles to provide N rotated digital signals;
   a data-directed scrambler having N inputs and N outputs for data-directed scrambling of the rotated digital signals to distribute the N equally-weighted digital signals to each of the N outputs of said scrambler such that the usage of the N outputs is dynamically balanced over a relatively small number of clock cycles.

2. Apparatus as defined in claim 1 wherein said rotator comprises circuit elements for advancing through a predetermined number of rotator states, wherein the N inputs of said rotator are shifted by a different number of steps with respect to the N outputs of said rotator in each of the rotator states.

3. Apparatus as defined in claim 2 wherein the circuit elements of said rotator comprise rotator cells for performing a selected shift in response to a control signal and a sequencer for generating said control signal in response to a clock signal.

4. Apparatus as defined in claim 2 wherein N is of the form $M \times 2^k$, where M is an odd integer and k is an integer, and wherein said rotator has M rotator states.

5. Apparatus as defined in claim 4 wherein the N inputs of said rotator are shifted by 0, N/M, 2N/M, . . . (M−1) N/M steps in respective rotator states.

6. Apparatus as defined in claim 4 wherein N is 6 and M is 3.

7. Apparatus as defined in claim 6 wherein the six inputs of said rotator are shifted by 0, 2 and 4 steps in respective rotator states.

8. Apparatus as defined in claim 2 wherein the predetermined number of rotator states is selected such that the frequency with which the rotator states are repeated is outside a signal band of said digital signals.

9. Apparatus as defined in claim 1 wherein said data-directed scrambler comprises one or more swapper cells and one or more direct connections interconnected to provide mutually exclusive selectable signal paths from said N inputs to said N outputs.

10. Apparatus as defined in claim 9 wherein each of said swapper cells comprises:
    two input terminals to receive respective inputs and two output terminals to produce corresponding outputs;
    circuitry responsive to a select signal for connecting the two input terminals to the two output terminals, either directly or reversely; and
    logic for generating the select signal.

11. Apparatus as defined in claim 10 wherein said logic comprises logic circuitry for storing the integrated difference of past swapper output signals, for determining a new value of the select signal based on the current two input values to the swapper cell and the stored integrated difference, and for updating the value of the stored integrated difference.

12. Apparatus as defined in claim 1 wherein said rotator comprises two or more sets of rotator cells connected in series between the N inputs and the N outputs of said rotator, wherein each of said sets of rotator cells passes its inputs directly to its outputs or shifts its inputs by a predetermined number of steps in response to a control signal, said rotator further comprising a controller for providing control signals to said sets of rotator cells in response to a clock signal.

13. Apparatus as defined in claim 1 wherein said data-directed scrambler comprises two or more sets of elements connected in series between the N inputs and the N outputs of said data-directed scrambler, wherein each of the sets of elements comprises swapper cells, or a combination of swapper cells and direct connections, each of said swapper cells comprising circuitry responsive to a select signal for connecting two input terminals to two output terminals, either directly or reversely, and logic for generating the select signal.

14. Apparatus as defined in claim 13 wherein N is 6.

15. Apparatus as defined in claim 14 wherein a first set includes three swapper cells, a second set includes two swapper cells and two direct connections, and a third set includes two swapper cells and two direct connections.

16. Apparatus as defined in claim 9 wherein said swapper cells are connected in an FFT-like partial butterfly configuration, and wherein direct connections are utilized in place of a swapper cell in each location of the partial butterfly configuration that does not require a swapper cell for swapping inputs to that location.

17. A method for processing N equally-weighted digital signals, where N is not an integer power of 2, comprising the steps of:
    rotating the N equally-weighted digital signals in a sequence of rotator states in respective clock cycles to provide N rotated digital signals; and
    data-directed scrambling of the N rotated digital signals in a data-directed scrambler having N inputs and N outputs to distribute the N equally-weighted digital signals to each of the N outputs of the scrambler such that the usage of the N outputs is dynamically balanced over a relatively small number of clock cycles.

18. A method as defined in claim 17 wherein the step of rotating the N equally-weighted digital signals comprises cycling through a predetermined number of rotator states, wherein the N equally-weighted digital signals are shifted by a different number of steps in each of the rotator states.

19. A method as defined in claim 18 wherein the step of rotating the N equally-weighted digital signals comprises generating a control signal in response to a clock signal and cycling through said predetermined number of rotator states in response to the control signal.

20. A method as defined in claim 18, wherein N is of the form $M \times 2^k$, where M is an odd integer and k is an integer, and wherein M rotator states are utilized.

21. A method as defined in claim 20, wherein the N equally-weighted digital signals are shifted by 0, N/M, 2N/M, . . . (M−1) N/M steps in respective rotator states.

22. A method as defined in claim 18 further comprising the step of selecting the predetermined number of rotator states such that the frequency with which the rotator states are repeated is outside a signal band of said digital signals.

23. Apparatus for processing N equally-weighted digital signals, wherein N is not an integer power of 2, comprising:
    a routing circuit, responsive to control signals and having N inputs and N outputs, for distributing the N equally-weighted digital signals to each of the N outputs such that the usage of the N outputs is dynamically balanced over a relatively small number of clock cycles; and a controller for generating said control signals in response to the digital signals and a sequencing signal.

24. A digital-to-analog converter comprising:

a code converter for converting a digital input to N equally-weighted digital signals, where N is not an integer power of 2;

a rotator for rotating the N equally-weighted digital signals in a sequence of rotator states in respective clock cycles to provide N rotated digital signals;

a data-directed scrambler having N inputs and N outputs for data-directed scrambling of the rotated digital signals to distribute the N equally-weighted digital signals to each of the N outputs of said scrambler such that the usage of the N outputs is dynamically balanced over a relatively small number of clock cycles;

a digital-to-analog converter circuit including N equally-weighted digital-to-analog converter elements for converting the scrambled digital signals to analog outputs; and a summing circuit for summing the outputs of the digital-to-analog converter elements to produce an analog output that represents the digital input.

25. An analog-to-digital converter comprising:

a summing unit for subtracting a feedback signal from an analog input signal and providing a summing unit output;

a loop filter for receiving said summing unit output and providing a filter output signal;

a multi-bit quantizer for providing a digital output in response to said filter output signal; and a digital-to-analog converter responsive to said digital output for providing said feedback signal to said summing unit, said digital-to-analog converter comprising:

an encoder for converting said digital output to N equally-weighted digital signals, where N is not an integer power of 2;

a rotator for rotating the N equally-weighted digital signals in a sequence of rotator states in respective clock cycles to provide N rotated digital signals;

a data-directed scrambler having N inputs and N outputs for data-directed scrambling of the rotated digital signals to distribute the N equally-weighted digital signals to each of the N outputs of said scrambler such that the usage of the N outputs is dynamically balanced over a relatively small number of clock cycles;

a digital-to-analog converter circuit for converting the scrambled digital signals to respective analog values; and a summing circuit for summing said analog values to produce said feedback signal, wherein the digital output of said multi-bit quantizer represents the analog input signal.

* * * * *